US012211946B2

(12) United States Patent
Pierce

(10) Patent No.: US 12,211,946 B2
(45) Date of Patent: Jan. 28, 2025

(54) MODULAR PHOTOVOLTAIC SYSTEM

(71) Applicant: Carrick J. Pierce, New York, NY (US)

(72) Inventor: Carrick J. Pierce, New York, NY (US)

(*) Notice: Subject to any disclaimer, the term of this patent is extended or adjusted under 35 U.S.C. 154(b) by 821 days.

(21) Appl. No.: 17/140,587

(22) Filed: Jan. 4, 2021

(65) Prior Publication Data
US 2021/0126137 A1 Apr. 29, 2021

Related U.S. Application Data

(63) Continuation of application No. 16/507,369, filed on Jul. 10, 2019, now Pat. No. 10,930,800.

(51) Int. Cl.
H01L 31/02 (2006.01)
H01L 31/0445 (2014.01)
H01L 31/048 (2014.01)

(52) U.S. Cl.
CPC .... *H01L 31/02002* (2013.01); *H01L 31/0445* (2014.12); *H01L 31/048* (2013.01)

(58) Field of Classification Search
CPC .... Y02E 10/52; F21S 11/005; H01L 31/0543; H01L 31/0547; H01L 31/02002; H01L 31/0445; H01L 31/048; H01L 31/047; H01L 31/054; Y10S 385/90
See application file for complete search history.

(56) References Cited

U.S. PATENT DOCUMENTS

| | | | |
|---|---|---|---|
| 4,367,366 A | 1/1983 | Bloss et al. | |
| 5,575,860 A * | 11/1996 | Cherney | H01L 31/0543 136/246 |
| 6,333,457 B1 | 12/2001 | Mulligan et al. | |
| 6,730,840 B2 | 5/2004 | Sasaoka et al. | |
| 8,049,098 B2 | 11/2011 | Gibson | |
| 9,293,621 B2 * | 3/2016 | Kim | H01L 31/052 |
| 9,673,344 B2 | 6/2017 | Davey et al. | |
| 2010/0006140 A1 | 1/2010 | Parker et al. | |
| 2011/0048503 A1 | 3/2011 | Karg | |
| 2014/0158182 A1 | 6/2014 | Watkins | |
| 2015/0125113 A1 * | 5/2015 | Schreiber | G02B 6/32 385/35 |
| 2016/0178879 A1 | 6/2016 | Ford et al. | |
| 2017/0235115 A1 | 8/2017 | Vasylyev | |

OTHER PUBLICATIONS

Franklin & Associates International Inc, International Search Report, Sep. 25, 2020, 13 pages.

* cited by examiner

*Primary Examiner* — Ratisha Mehta
(74) *Attorney, Agent, or Firm* — Goldstein Law Offices, P.C.

(57) ABSTRACT

A modular photovoltaic system adapted for collecting light rays from a solar light source to generate electrical current, the system having a light-tracking solar collector adapted to collect the light rays, an edge-lit photovoltaic array, and a transport conduit adapted to transport the light rays to the edge-lit photovoltaic array. The edge-lit photovoltaic array has a plurality of edge-lit photovoltaic panels, each having a transparent diffusing pane positioned between two backing panels with inwardly directed photovoltaic surfaces. Each edge-lit photovoltaic panel perpendicularly contacts a lateral light distributor attached to the transport conduit, causing the transparent diffusing pane to illuminate the photovoltaic surfaces to generate electrical current. The light-tracking solar collector is adapted to rotate to remain oriented toward the solar light source.

4 Claims, 7 Drawing Sheets

MODULAR PHOTOVOLTAIC SYSTEM

CROSS REFERENCES AND RELATED SUBJECT MATTER

This application is a continuation of U.S. patent application Ser. No. 16/507,369 filed Jul. 10, 2019, which is relied upon and incorporated herein by reference in its entirety. The entire disclosure of any publication or patent document mentioned herein is entirely incorporated by reference.

TECHNICAL FIELD

The present disclosure relates generally to a photovoltaic system for generating electricity using solar energy. In particular, the present disclosure relates to a modular photovoltaic system with a compact edge-lit photovoltaic array which is illuminated by a separate solar collector.

BACKGROUND

Solar energy is an increasingly important form of renewable energy. However, traditional solar panel arrays must be exposed to direct sunlight, and therefore require significant amounts of space in order to ensure that the solar panels are unobstructed. Solar panel arrays for powering houses may occupy tens or even hundreds of square feet worth of rooftop space, while solar power plants may require many square miles of ground space. Furthermore, traditional solar panels remain exposed to the elements as well as environmental debris, and their effectiveness may rapidly degrade without labor-intensive cleaning and maintenance. Even though solar cell technology continues to improve, the maintenance and space requirements for the proper operation of traditional solar panel arrays pose a major barrier against further adoption of solar energy.

Many examples of improved solar panels can be found within the prior art. These devices seek to alleviate the cost of operating solar panel arrays by improving the efficiency of the solar panels, thus increasing the amount of electricity which can be generated for a given unit of surface area. However, these improved solar panels still require direct exposure to sunlight, and therefore fail to address the space requirements and maintenance overhead inherent in the operation of traditional solar panel arrays. Furthermore, as the efficiency of new solar panel technology continues to increase, the investment value of existing solar panel arrays will decay, as the operators of the now obsolescent solar panels must choose between upgrading their solar panel arrays at great cost, or making inefficient use of ground and surface area by continuing to operate older, less effective solar panels.

An urgent need therefore exists for an improved photovoltaic system which is compact and capable of generating electricity using a fraction of the surface area of a traditional solar panel array, reduces maintenance overhead, and is also modular and is capable of being upgraded.

In the present disclosure, where a document, act or item of knowledge is referred to or discussed, this reference or discussion is not an admission that the document, act or item of knowledge or any combination thereof was at the priority date, publicly available, known to the public, part of common general knowledge or otherwise constitutes prior art under the applicable statutory provisions; or is known to be relevant to an attempt to solve any problem with which the present disclosure is concerned.

While certain aspects of conventional technologies have been discussed to facilitate the present disclosure, no technical aspects are disclaimed and it is contemplated that the claims may encompass one or more of the conventional technical aspects discussed herein.

BRIEF SUMMARY

An aspect of an example embodiment in the present disclosure is to provide a photovoltaic system capable of generating electric current using solar without directly exposing its photovoltaic components to the sun. Accordingly, the present disclosure provides a modular photovoltaic system comprising an edge-lit photovoltaic array, and a light tracking solar collector adapted to collect light rays from a solar light source and transport the collected light rays to the edge lit photovoltaic array using a light transport conduit. The light-tracking solar collector employs a light focusing means, such as a lens, to collect and focus the light rays without requiring the edge-lit photovoltaic array to be directly exposed to the solar light source.

It is another aspect of an example embodiment in the present disclosure to provide a photovoltaic system which increases the density of photovoltaic surfaces without greatly increasing the area occupied by the photovoltaic system. Accordingly, the present disclosure provides an edge-lit photovoltaic array comprising a plurality of stacked edge-lit photovoltaic panels each having a transparent diffusing pane positioned between two backing panels with photovoltaic surfaces, and a lateral light distributor which is in perpendicular contact with each edge-lit photovoltaic panel. Light rays from the solar collector are transferred to the lateral light distributor via the transport conduit, while the lateral light distributor illuminates the transparent diffusing pane and the photovoltaic surfaces of each edge-lit photovoltaic panel.

It is yet another aspect of an example embodiment in the present disclosure to provide a photovoltaic system which is capable of tracking the sun to maximize the amount of light collected. Accordingly, the present disclosure provides a light-tracking solar collector having a light sensor for determining the position of the solar light source, and a motorized tracking mechanism adapted to rotate and/or elevate the solar collector in order to orient the light focusing means towards the solar light source.

The present disclosure addresses at least one of the foregoing disadvantages. However, it is contemplated that the present disclosure may prove useful in addressing other problems and deficiencies in a number of technical areas. Therefore, the claims should not necessarily be construed as limited to addressing any of the particular problems or deficiencies discussed hereinabove. To the accomplishment of the above, this disclosure may be embodied in the form illustrated in the accompanying drawings. Attention is called to the fact, however, that the drawings are illustrative only. Variations are contemplated as being part of the disclosure.

BRIEF DESCRIPTION OF THE DRAWINGS

In the drawings, like elements are depicted by like reference numerals. The drawings are briefly described as follows.

The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete and fully conveys the scope of the present disclosure to those skilled in the art.

DETAILED DESCRIPTION OF THE PREFERRED EMBODIMENTS

Figure 1:
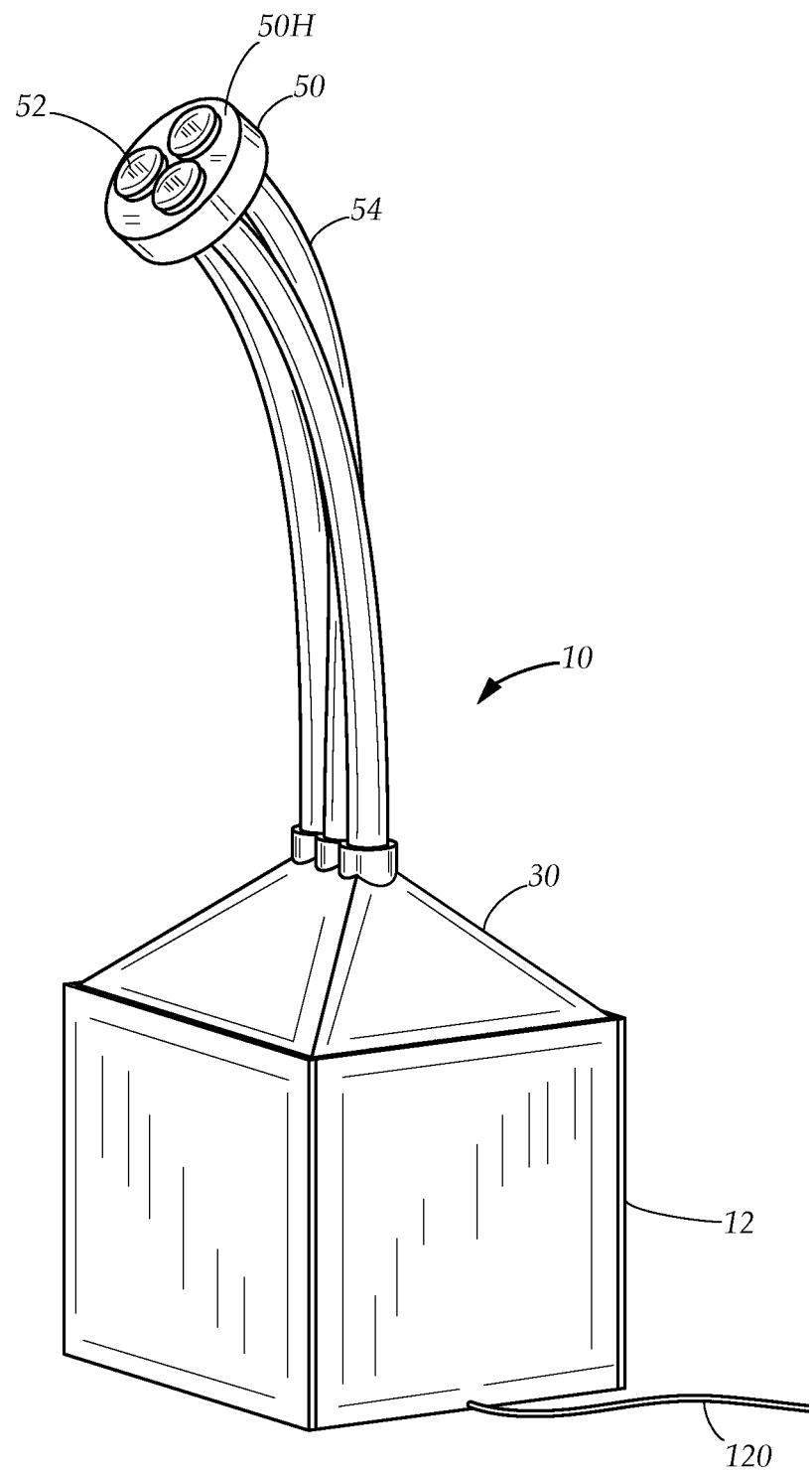
FIG. 1 is diagrammatical perspective view of a modular photovoltaic system, showing an edge-lit photovoltaic array attached to a light-tracking solar collector for collecting light, in accordance with an embodiment in the present disclosure.
Figure 6A:
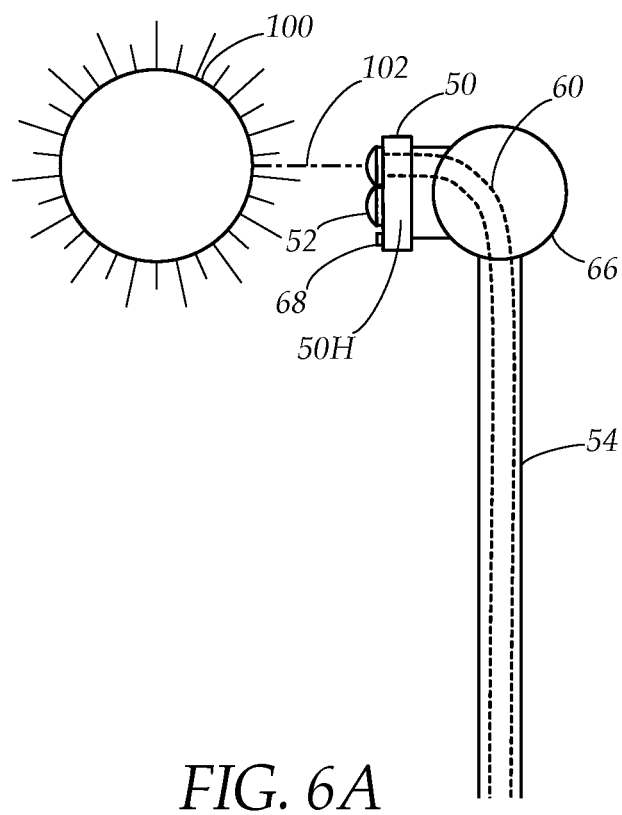
FIG. 6A is a diagrammatic cross-section view of the light-tracking solar collector, showing the solar collector continuously tracking and facing a solar light source using a tracking mechanism and light sensor, in accordance with an embodiment in the present disclosure.

FIG. 1 illustrates a modular photovoltaic system 10 adapted to generate electrical current using solar energy, comprising an edge-lit photovoltaic array 12, a light-tracking solar collector 50, and a transport conduit 54. Referring briefly to FIG. 6A while continuing to refer to FIG. 1, the transport conduit 54 contains a light transport medium 60, such as a fiber optic cable, which is adapted to transport light by internal reflection, allowing the light-tracking solar collector 50 to collect light rays 102 emitted from a solar light source 100, such as the sun, which are then delivered to the edge-lit photovoltaic array 12 via the transport conduit 54.

Figure 2:
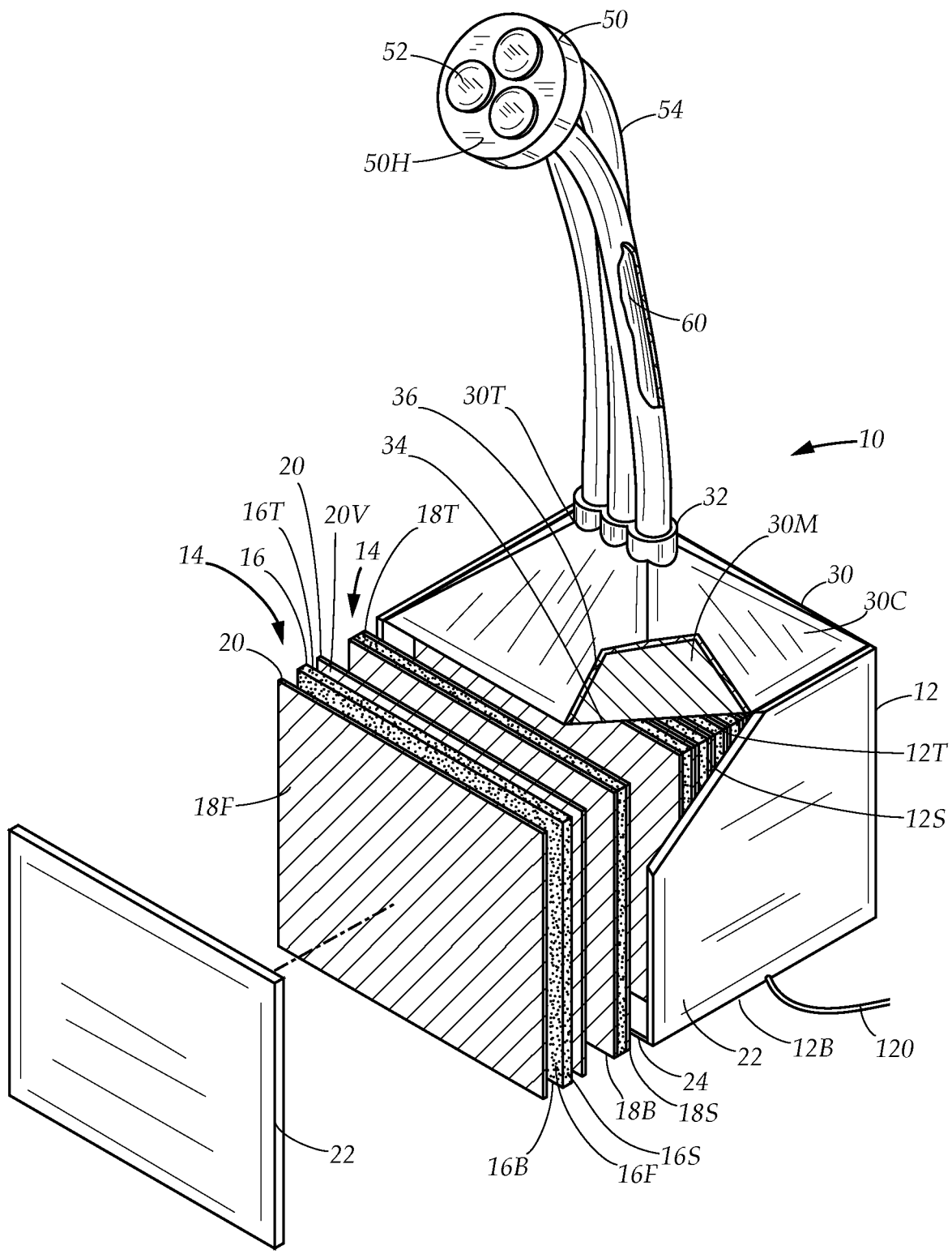
FIG. 2 is a diagrammatical exploded view showing the edge-lit photovoltaic panel array disassembled to reveal a plurality of edge-lit photovoltaic panels, further showing a lateral light distributor which distributes light to the edge-light photovoltaic panels, in accordance with an embodiment in the present disclosure.
Figure 3:
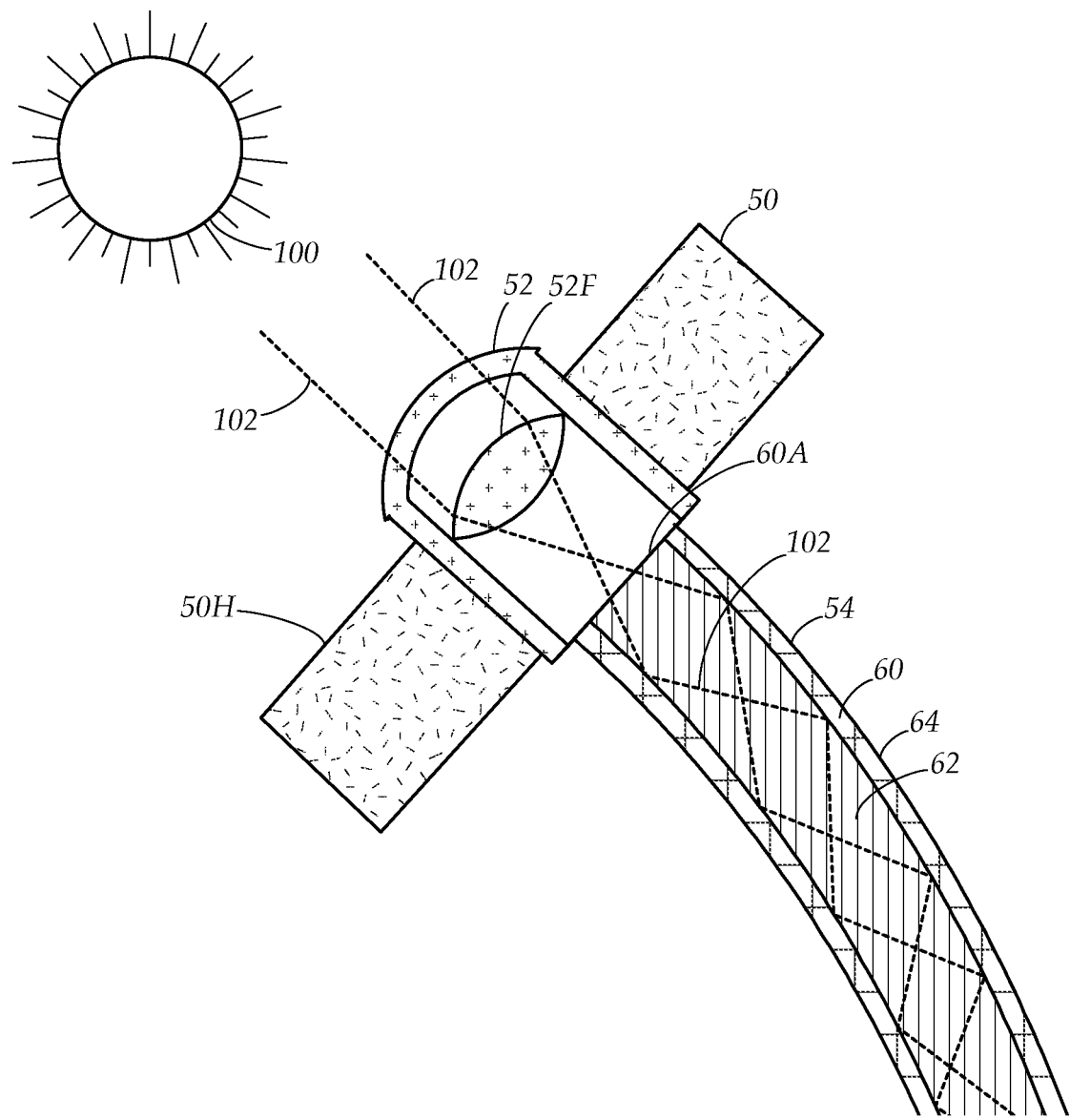
FIG. 3 is a diagrammatic cross-section view of the light-tracking solar collector, showing a solar collector head with a lens and a light transport conduit, in accordance with an embodiment in the present disclosure.

Referring to FIG. 2 and FIG. 3 while continuing to refer to FIG. 1, the edge-lit photovoltaic array 12 is formed using one or more edge-lit photovoltaic panels 14. Each edge-lit photovoltaic panel 14 has a transparent central pane 16 positioned between, and in contact with, a pair of backing panels 20. Each transparent central pane 16 is formed of a transparent material such as glass, polycarbonate, or other similar material capable of transmitting light. Each transparent central pane 16 has a light receiving edge 16T which is transparent and is adapted to receive light, and a pair of opposing light emitting faces 16F. The light emitting faces 16F each have an irregular surface which is adapted to scatter light, and the irregular surface may be produced by etching, scoring, or a similar process. Each backing panel 20 has an inward-facing photovoltaic surface 20V in contact with one of the light emitting faces 16F, comprising one or more solar cells which are adapted to convert energy from photons within the light rays 102 into electrical current. An output line 120 may be employed to carry the electrical current produced by the edge-lit photovoltaic array 12 to be consumed or stored as necessary.

When multiple edge-lit photovoltaic panels 14 are employed in the edge-lit photovoltaic array 12, the edge-lit photovoltaic panels 14 are positioned in parallel. In a preferred embodiment, each edge-lit photovoltaic panel 14 is rectangular in shape, and has a panel top edge 18T which exposes the light receiving edge 16T of the transparent diffusing pane 16, a pair of panel side edges 18S, and a panel bottom edge 18B. The transparent diffusing pane 16 further has a pair of transparent side edges 16S, and a transparent bottom edge 16B. The edge-lit photovoltaic panels 14 are stacked together to give the edge-lit photovoltaic array 12 a substantially block-like shape, while the panel top edges 18T of each edge-lit photovoltaic panel 14 are substantially aligned to form a rectangular top face 12T. In a preferred embodiment, the transparent side edges 16S, the transparent bottom edge 16B, and the light receiving edge 16T are coextensive with the panel side edges 18S, the panel bottom edge 18B, and the panel top edge 18T respectively. The panel side edges 18S align to collectively form a pair of rectangular side faces 12S, while the panel bottom edges 18B align to collectively form a rectangular bottom face 12B.

The edge-lit photovoltaic array 12 further has a plurality of reflective side panels 22 and a reflective bottom panel 24 positioned over the rectangular side faces 12S and the rectangular bottom face 12B respectively, which cover the panel side edges 18S and the panel bottom edge 18B of each edge-lit photovoltaic panel 14 within the edge-lit photovoltaic array 12. The reflective side and bottom panels 22, 24 are adapted to trap light within the edge-lit photovoltaic array 12 and facilitate internal reflection by reflecting the light rays 102 which travel through the transparent side edges 16S or the transparent bottom edge 16B transparent diffusing pane 16. In certain embodiments, the reflective side and bottom panels 22, 24 may incorporate mylar or dielectric mirrors, as well as any other suitable reflective material. The edge-lit photovoltaic array 12 may have a fully sealed exterior to protect the edge-lit photovoltaic panels from being damaged or adversely impacted by the elements or by environmental debris.

Figure 4:
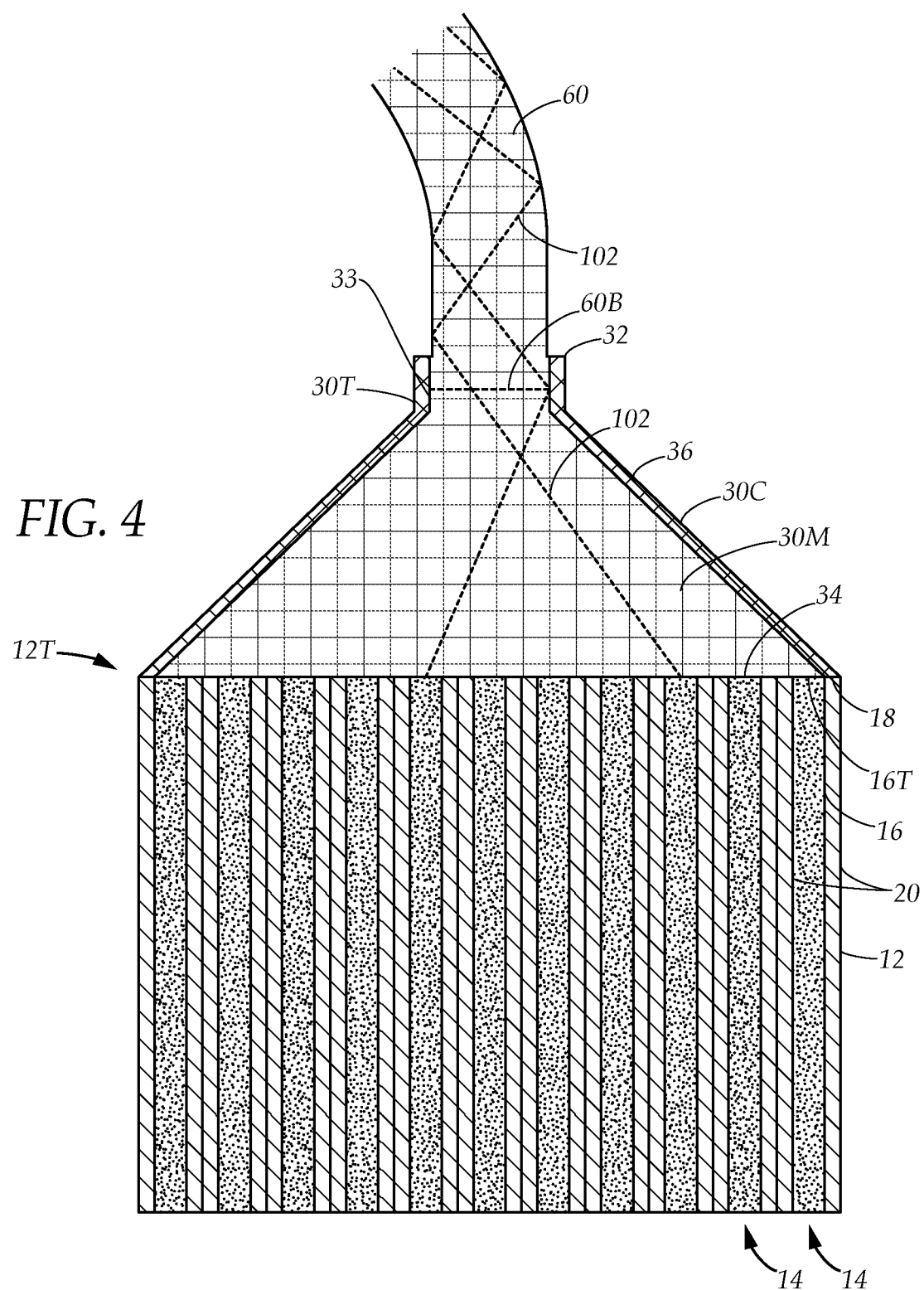
FIG. 4 is a diagrammatic cross-section view of the edge-lit photovoltaic array and the lateral light distributor in a tapered configuration, in accordance with an embodiment in the present disclosure.

Turning now to FIG. 4 while continuing to refer to FIG. 2, the modular photovoltaic system 10 further has a lateral light distributor 30 which is adapted to receive the light rays 102 collected by the light-tracking solar collector 50, and distribute the light rays 102 to each edge-lit photovoltaic panel 14 within the edge-lit photovoltaic array 12. The lateral light distributor 30 comprises a light distributing medium 30M which has a collecting point 32 which is connected to the transport conduit 54, and a distributing surface 34 which is adapted to contact the light receiving edge 16T of each edge-lit photovoltaic panel 14 within the edge-lit photovoltaic array 12, forming a boundary through which the light rays 102 may be propagated. The collecting point 32 includes an orifice 33. The transport conduit 54 extends into the orifice 33. In a preferred embodiment, the distributing surface 34 is substantially flat, and is positioned perpendicular to, and in contact with, the aligned panel top edges 18T of each edge-lit photovoltaic panel 14. The light distributing medium 30M is transparent and capable of transmitting light. Similarly to the transparent diffusing pane 16 of the edge-lit photovoltaic panel 14, the light distributing medium 30M may be formed using glass, polycarbonate, or other suitable transparent material. The light rays 102 entering the lateral light-distributor 30 are transported laterally across the distributing surface 34 to each edge-lit photovoltaic panel 14, via contact between the light receiving edges 16T and the distributing surface 34. The light distributing medium 30M is further covered with an inwardly oriented reflective layer 36, which traps and reflects the light rays 102 within the lateral light distributor 30. The reflective layer 36 may be composed of mylar or dielectric mirrors or another suitable reflective material. In a preferred embodiment, the reflective layer 36 covers substantially the entirety of the lateral light distributor 30 with the exception of the distributing surface 34. In a preferred embodiment, the distributing surface 34 has sufficient area to completely cover the light receiving edge 16T of each edge-lit photovoltaic panel 14, and may be rectangular to conform to the top face 12T of the edge-lit photovoltaic array 12.

Figure 5:
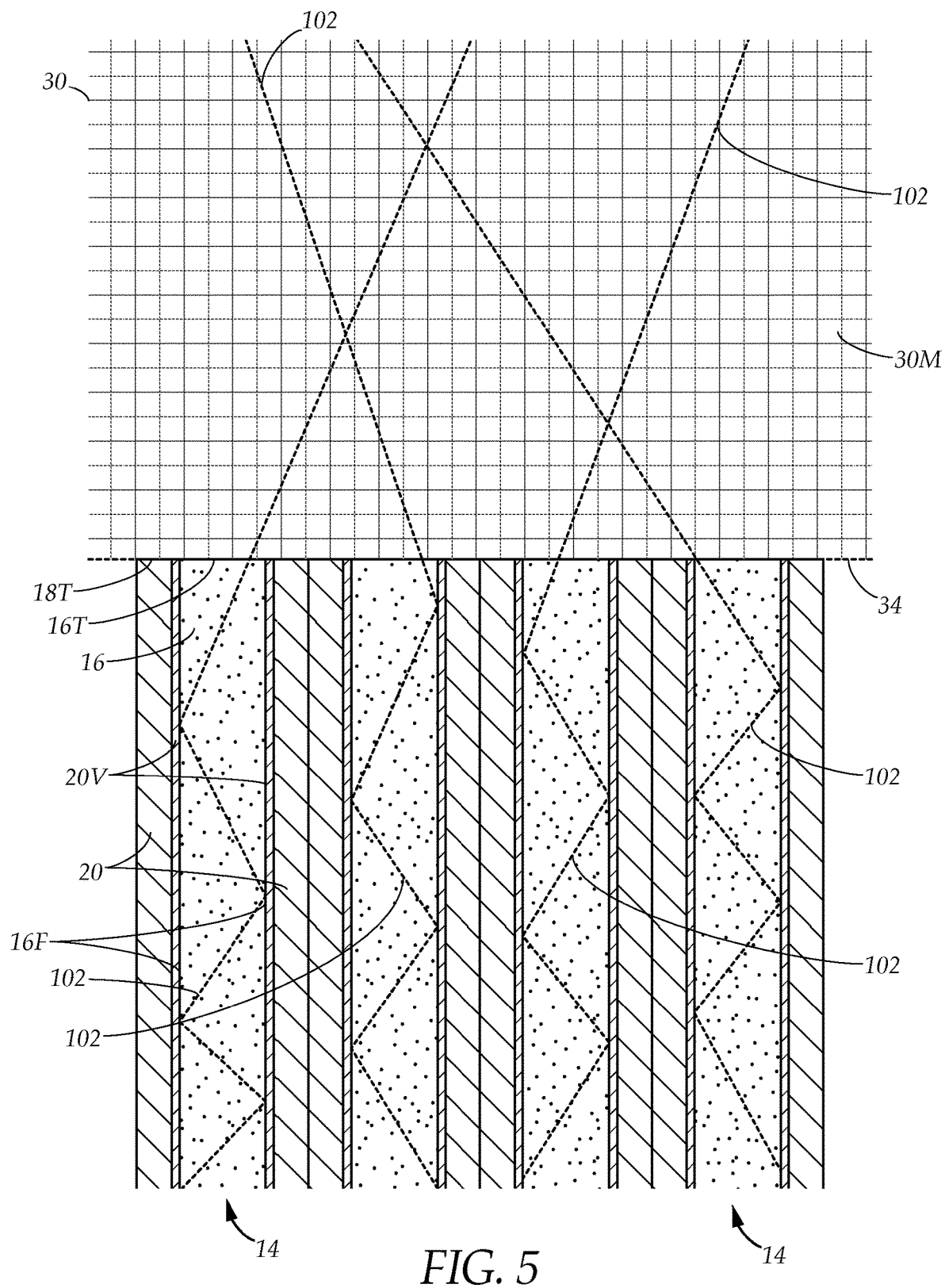
FIG. 5 is a diagrammatic cross-section view of the edge-lit photovoltaic array, showing the structure of the edge-lit photovoltaic panels, with each panel having a transparent central pane positioned between two backing panels each having an inward-facing photovoltaic surface, in accordance with an embodiment in the present disclosure.
Figure 6B:
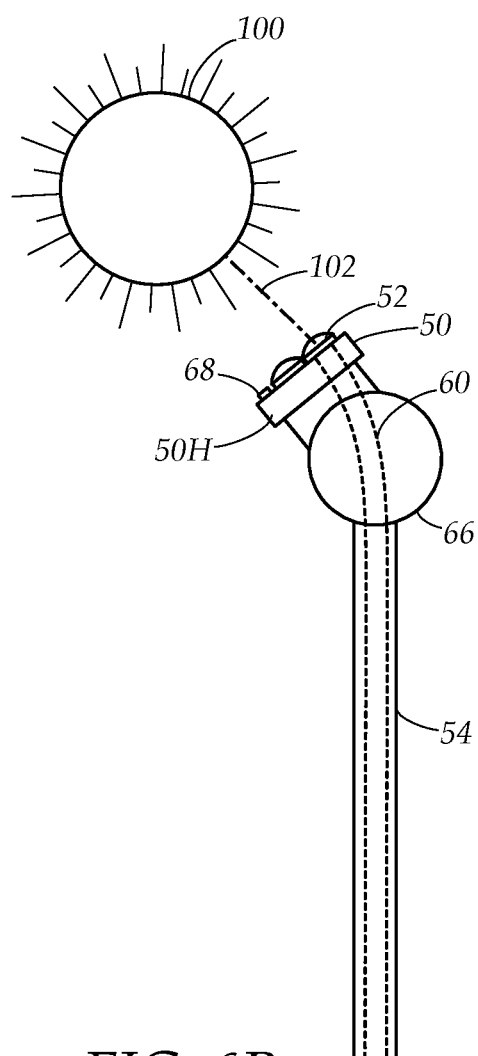
FIG. 6B is a diagrammatic cross-section view of the light-tracking solar collector, showing the collector head being elevated to face the solar light source, in accordance with an embodiment in the present disclosure.
Figure 6C:
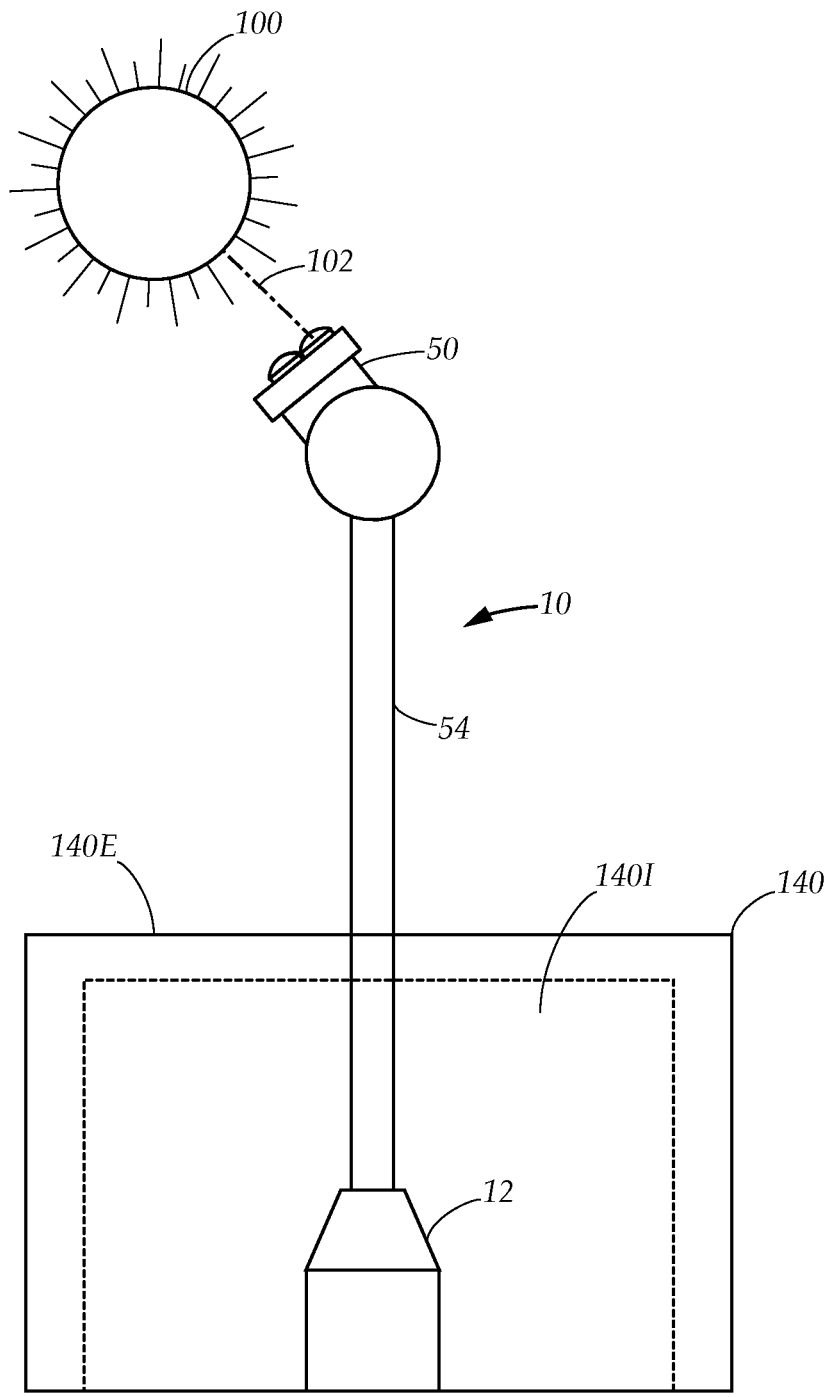
FIG. 6C is a diagrammatic cross-section view of the modular photovoltaic system deployed within a building, whereby the light tracking solar collector is positioned in view of the solar source and the edge-lit photovoltaic array is positioned within the interior of the building, in accordance with an embodiment in the present disclosure.

Referring to FIG. 5 while also referring to FIG. 6A-C, the light rays 102 travel through the boundary between the distributing surface 34 of the lateral light distributor 30 and the light receiving edges 16T of each edge-lit photovoltaic panel 14, and are transmitted through the transparent diffusing pane 16 before being scattered through the light emitting faces 16F to illuminate the photovoltaic surfaces 20V of the backing panels 20. The solar cells within the photovoltaic surfaces 20V are exposed to the light rays 102, and are able to generate electrical current without being directly exposed to the solar light source 100. Furthermore, any number of edge-lit photovoltaic panels 14 may be employed, thereby greatly increasing the combined area of the photovoltaic surfaces 20V that can be deployed at a given space, when compared to conventional solar panels which must be directly exposed to sunlight. In a non-limiting example, each edge-lit photovoltaic panel 14 may have an area of one square foot and a thickness of 0.8 inches. The combined photovoltaic surfaces 20V of each edge-lit photovoltaic panel 14 would have an area of two square feet. An edge-lit photovoltaic array 12 comprising fifteen individual edge-lit photovoltaic panels 14 would have a volume of one cubic foot and have thirty square feet of photovoltaic surfaces 20V, while occupying only a single square foot if placed on a flat surface. Note that each edge-lit photovoltaic panel 14 may have a variable area and thickness.

Returning to FIGS. 2 and 4, in a preferred embodiment, the lateral light distributor 30 may have a tapering configuration 30C in the form of a pyramid or cone with a base corresponding to the distributing surface 34, and an upper tip 30T positioned above the distributing surface 34. The collecting point 32 is located at the upper tip 30T, and the light rays 102 travel downwardly from the upper tip 30T through the light distributing medium 30 towards the distributing surface 34. Furthermore, the pyramidal or cone-like shape of the tapering configuration 30C causes any reflected light rays 102 traveling within the light distributing medium 30M to be directed towards the distributing surface 34. Note that in alternate embodiments, the lateral light distributor 30 may be in the form of a substantially flat panel or block.

Returning to FIGS. 2, 3 and 4, the ability of the edge-lit photovoltaic array 12 to generate electrical current is dependent on the amount of light from the solar light source 100, which is collected by the light-tracking solar collector 50. In a preferred embodiment, the light-tracking solar collector 50 has a collector head 50H with one or more light focusing means 52 positioned therein. In a preferred embodiment, the light focusing means 52 comprises a lens 52F. The transport conduit 54 joins the collector head 50H to the collecting point 32 of the lateral light-distributor 30. The light transport medium 60 has a first end 60A which is connected to the collector head 50H, and a second end 60B which is operably connected to the lateral light distributor 30 via the collecting point 32. The second end 60B extends through the orifice 33 of the collecting point 32 into the lateral light-distributor 30. The second end 60B terminates at the collecting point 32.

Referring to FIGS. 6A-B, while also referring to FIGS. 2, 3, and 4, the collector head 50H is positioned facing the solar light source 100, allowing the light rays 102 to be collected by the light focusing means 52. The collected light rays 102 are directed towards the first end 60A of the light transport medium 60 and are transported to the collecting point 32 and the lateral light distributor 30 via the second end 60B. In a preferred embodiment, the light transport medium 60 comprises a fiber optic cable 62 and reflective cladding 64 to effect internal reflection of the light rays 102 through the light transport medium 60. Note that other light focusing means 52 may be employed in place of, or in combination with a lens 52F. For example, the light rays 102 may be gathered and focused upon the first end 60A of the light transport medium 60 using reflective mirrors, mirror dishes, or other suitable means as will be apparent to a person of ordinary skill in the art in the field of the invention.

In a preferred embodiment, the light-tracking solar collector 50 is adapted to swivel and/or rotate to allow the collector head 50H to remain oriented towards the solar light source 100, thereby maximizing the amount of light to which the collector head 50H is exposed as the sun moves across the sky. The light-tracking solar collector 50 may therefore have a tracking mechanism 66 adapted to rotate and/or elevate the collector head 50H in response to the movement of the sun. The tracking mechanism 66 may be implemented using a motor or similar apparatus. The transport conduit 54 is correspondingly flexible to allow the movement of the collector head 50H and/or the light-tracking solar collector 50. The tracking mechanism 66 may be controlled using one or more light sensors 68 which determine the position of the solar light source 100.

Referring to FIG. 2, in order to increase the amount of light which can be delivered to the edge-lit photovoltaic array 12, the light-tracking solar collector 50 may have multiple light focusing means 52. In one embodiment, the collector head 50H may have three light focusing means 52, and three transport conduits 54. All three transport conduits 54 are attached to the collecting point 32 of the lateral light distributor 30, thereby increasing the amount of light which is collected and delivered to the edge-lit photovoltaic array 12. Furthermore, the modular photovoltaic system 10 may employ multiple edge-lit photovoltaic arrays 12, each with one or more light-tracking solar collectors 50.

Referring to FIG. 6C, the transport conduit 54 may be any length, allowing the edge-lit photovoltaic array 12 to be positioned separately from the light-tracking solar collector 50, as allowed by the length of the transport conduit 54. In one embodiment, the modular photovoltaic system 10 may be employed within a building 140 or other structure which has an interior space 140I. The light-tracking solar collector 50 may be placed on the exterior 140E of the building 140 so that it can be exposed to the solar light source 100, while the edge-lit photovoltaic array 12 is positioned within the interior space 140I, thus preventing the need to occupy the exterior 140E with solar panels and further protecting the edge-lit photovoltaic array 12 from exposure to the elements.

Referring to FIG. 2, in a preferred embodiment, the modular photovoltaic system 10 allows the various components of the system to be replaced in a modular fashion, thus allowing the modular photovoltaic system 10 to be repaired or upgraded. For example, each edge-lit photovoltaic panel 14 may be removed from the edge-lit photovoltaic array 12 to be replaced. Furthermore, the edge-lit photovoltaic array 12 may be detached from the lateral light distributor 30 and/or the transport conduit 54.

Referring to FIG. 5, in certain embodiments, the edge-lit photovoltaic panels 14 may instead have backing panels 20 with double-sided photovoltaic surfaces 20V. The backing panels 20 with double-sided photovoltaic surfaces 20V may therefore be positioned between two transparent diffusing panes 16, thus ensuring that each photovoltaic surface 20V is in contact with one of the light emitting faces 16F.

It is understood that when an element is referred hereinabove as being "on" another element, it can be directly on the other element or intervening elements may be present therebetween. In contrast, when an element is referred to as being "directly on" another element, there are no intervening elements present.

Moreover, any components or materials can be formed from a same, structurally continuous piece or separately fabricated and connected.

It is further understood that, although ordinal terms, such as, "first," "second," "third," are used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, example embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In conclusion, herein is presented a modular photovoltaic system. The disclosure is illustrated by example in the drawing figures, and throughout the written description. It should be understood that numerous variations are possible, while adhering to the inventive concept. Such variations are contemplated as being a part of the present disclosure.

What is claimed is:

1. A modular photovoltaic system adapted to collect light rays emitted from a solar light source, comprising:

a solar collector comprising a light focusing means and a plurality of transport conduits, each of the plurality of transport conduits including a first end, a second end, and a light transport medium extending from the first end to the second end, wherein the light focusing means is configured to focus light rays from a solar light source upon the first end of each of the plurality of transport conduits;

an edge-lit photovoltaic array including a plurality of edge-lit photovoltaic panels, the edge-lit photovoltaic panels each having a transparent diffusing pane positioned between a pair of backing panels, one of the pair of backing panels of any one of the edge-lit photovoltaic panels is positioned against a backing panel of one of the pair of backing panels of another, adjacent edge-lit photovoltaic panel, the transparent diffusing pane having a transparent light receiving edge and a pair of light emitting faces including an irregular surface having one or more solar cells thereon for generating an electrical current without direct exposure to sunlight, each of the backing panels including an inwardly facing photovoltaic surface in contact with one of the light emitting faces, each photovoltaic surface adapted to generate electrical current when exposed to the light rays, each of the plurality of edge-lit photovoltaic panels substantially rectangular in shape and including a panel top edge, a panel bottom edge, and a pair of panel side edges, the light receiving edge of each of the transparent diffusing panes coextensive with the panel top edge, and the transparent diffusing pane including a transparent bottom edge which is coextensive with the panel bottom edge and a pair of transparent side edges which are coextensive with the panel side edges, the panel side edges and the panel bottom edges of the plurality of edge-lit photovoltaic panels aligned contiguously in parallel to form a pair of rectangular side faces, a rectangular top face, and a rectangular bottom face, respectively, the edge-lit photovoltaic array further including a reflective side panel covering the rectangular side face and a reflective bottom panel covering the rectangular bottom face, wherein the reflective side panel and reflective bottom panel include a reflective material configured to reflect the light rays within each transparent diffusing pane; and a lateral light distributor comprising a rigid light distributing medium, a collecting point, and a distributing surface positioned substantially flat and in contact with the rectangular top face of the edge-lit photovoltaic panels, the collecting point disposed opposite and spaced apart from the distributing surface and including an orifice in communication with the second ends of each of the plurality of transport conduits such that the second ends terminate at the collecting point, the light distributing medium transparent and adapted to receive the light rays from the transport conduits and distribute the light rays across the distributing surface, the light distributing medium spanning the lateral light distributor from the collecting point to the distributing surface, the lateral light distributor further including an inwardly oriented reflective layer covering the light distributing medium configured to trap and reflect light rays within the lateral light distributor, the distributing surface positioned perpendicularly with respect to the edge-lit photovoltaic panels, the distributing surface transferring light rays to each of the light receiving edges and scattering the lights rays through the light emitting faces, the lateral light distributor tapering in cross-section from the distributing surface to the collecting point such that the inwardly oriented reflective layer faces the distributing surface to direct light traveling in the light distributing medium to the distributing surface, wherein the lateral light distributor, the reflective side panel covering, and the reflective bottom panel covering seal the edge-lit photovoltaic panels within the lateral light distributor.

2. The modular photovoltaic system described in claim 1, wherein the solar collector comprises a light sensor adapted to locate the solar light source, and tracking mechanism adapted to rotate the solar collector and orient the light focusing means towards the solar light source.

3. The modular photovoltaic system of claim 2, wherein the light focusing means is a lens adapted to focus and direct the light rays towards the first end of the transport conduit.

4. The modular photovoltaic system of claim 2, wherein the light tracking solar collector is disposed on an exterior a building and at least a portion of the edge-lit photovoltaic array is disposed within an interior space of the building.

* * * * *